US010867671B1

(12) United States Patent
Hamada et al.

(10) Patent No.: US 10,867,671 B1
(45) Date of Patent: Dec. 15, 2020

(54) TECHNIQUES FOR APPLYING MULTIPLE VOLTAGE PULSES TO SELECT A MEMORY CELL

(71) Applicant: Micron Technology, Inc., Boise, ID (US)

(72) Inventors: Josephine T. Hamada, Folsom, CA (US); Mingdong Cui, Folsom, CA (US); Joseph M. McCrate, Boise, ID (US); Karthik Sarpatwari, Boise, ID (US); Jessica Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/460,863

(22) Filed: Jul. 2, 2019

(51) Int. Cl.
*G11C 13/00* (2006.01)
*H01L 45/00* (2006.01)
*G11C 5/14* (2006.01)

(52) U.S. Cl.
CPC .......... *G11C 13/0069* (2013.01); *G11C 5/147* (2013.01); *G11C 13/003* (2013.01); *G11C 13/0004* (2013.01); *G11C 13/0026* (2013.01); *G11C 13/0028* (2013.01); *G11C 13/0038* (2013.01); *H01L 45/141* (2013.01); *G11C 2013/0078* (2013.01)

(58) Field of Classification Search
CPC . G11C 13/0069; G11C 5/147; G11C 13/0028; G11C 13/0026; G11C 13/0004; G11C 13/0038; G11C 13/003; G11C 2013/0078; H01L 45/141
See application file for complete search history.

(56) References Cited

U.S. PATENT DOCUMENTS

| 10,269,442 B1* | 4/2019 | Tortorelli | G11C 13/004 |
| 2011/0310652 A1* | 12/2011 | Kim | G11C 13/0007 365/148 |
| 2013/0051137 A1 | 2/2013 | Zeng | |
| 2014/0362650 A1* | 12/2014 | Castro | G11C 13/0004 365/189.011 |

(Continued)

FOREIGN PATENT DOCUMENTS

KR  20190066271 A  6/2019

OTHER PUBLICATIONS

ISA/KR, International Search report and Written Opinion of the International Searching Authority, Int'l Appl. No. PCT/US2020/037930, Sep. 23, 2020, Korean Intellectual Property Office, Seo-gu, Daejeon, Republic of Korea, 10 pgs.

*Primary Examiner* — Mushfique Siddique
(74) *Attorney, Agent, or Firm* — Holland & Hart LLP

(57) ABSTRACT

Methods, systems, and devices for memory cell selection to enable a memory device to select a targeted memory cell during a write operation are described. The memory device may apply a first pulse to a selected bit line of the targeted memory cell while applying a voltage to deselected word lines to prevent current leakage. If the targeted memory is not selected after the first pulse, the memory device may apply a second pulse to the selected bit line while applying a voltage to the deselected word lines. If the targeted memory cell is not selected following the second pulse, the memory device may apply a third pulse to the selected bit line while applying the voltage to the deselected word lines. The memory device may detect a snapback event after any of the pulses if the targeted memory cell is selected.

24 Claims, 10 Drawing Sheets

(56) References Cited

U.S. PATENT DOCUMENTS

| | | | |
|---|---|---|---|
| 2015/0294716 A1* | 10/2015 | Tortorelli | G11C 13/004 |
| | | | 365/163 |
| 2016/0071584 A1* | 3/2016 | Castro | G11C 13/003 |
| | | | 365/163 |
| 2017/0047118 A1 | 2/2017 | Castro | |
| 2017/0352397 A1 | 12/2017 | Guo et al. | |
| 2018/0190353 A1* | 7/2018 | Srinivasan | G11C 13/0069 |
| 2019/0027202 A1 | 1/2019 | Bedeschi et al. | |
| 2019/0206491 A1* | 7/2019 | Banerjee | G06F 3/0659 |
| 2020/0066343 A1* | 2/2020 | Castro | G11C 13/0007 |

* cited by examiner

TECHNIQUES FOR APPLYING MULTIPLE VOLTAGE PULSES TO SELECT A MEMORY CELL

BACKGROUND

The following relates generally to a system that includes at least one memory device and more specifically to memory cell selection.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memory technologies, and others. Memory devices may be volatile or non-volatile. Improving memory devices, generally, may include increasing memory cell density, increasing read/write speeds, increasing reliability, increasing data retention, reducing power consumption, or reducing manufacturing costs, among other metrics. In some memory devices, memory cell selection schemes may be unable to select all of a desired set of memory cells (e.g., for a read or a write operation), resulting in a higher error rate.

DETAILED DESCRIPTION

Figure 1:
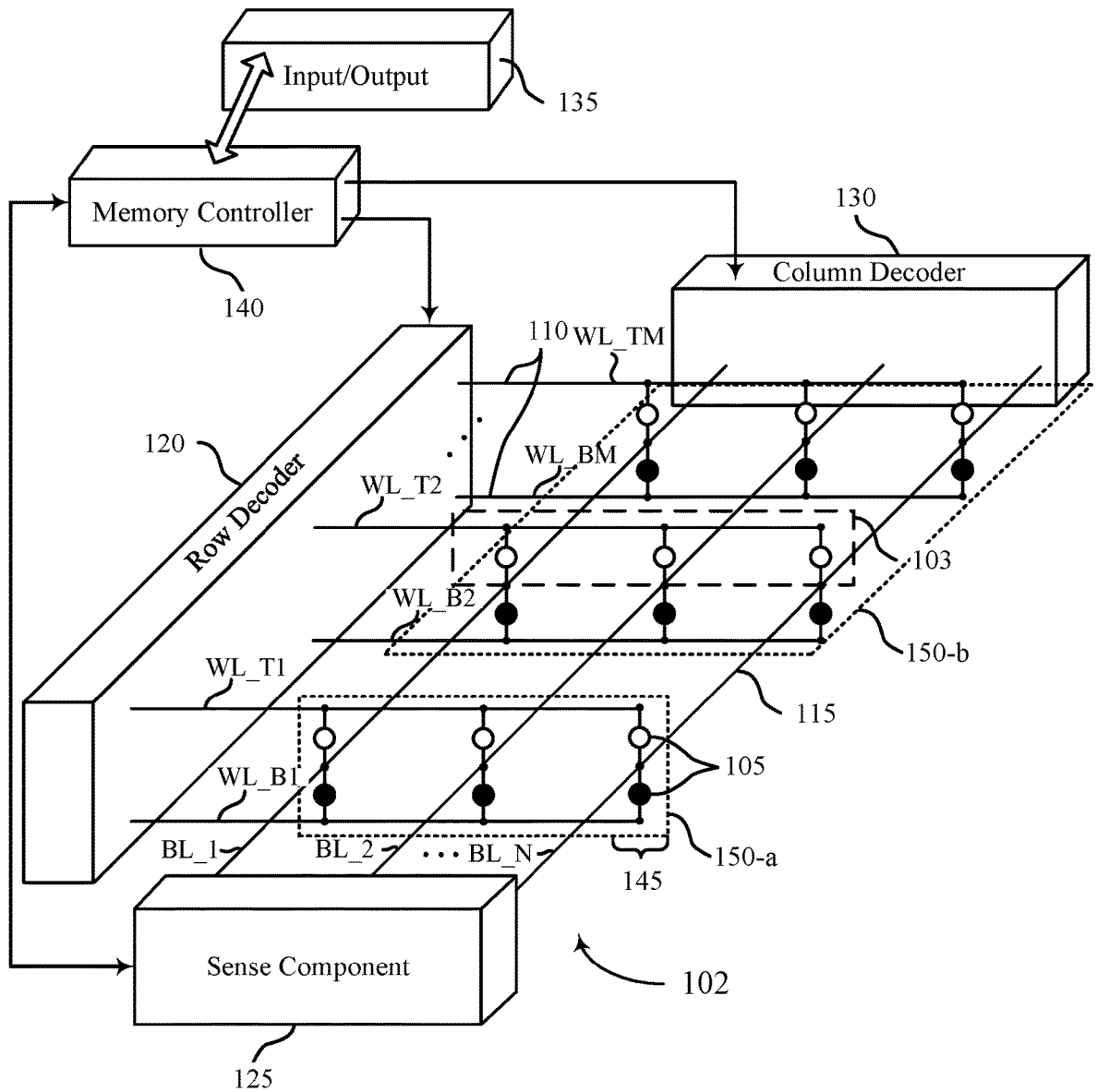
FIG. 1 illustrates an example of a memory device that supports memory cell selection in accordance with examples as disclosed herein.

A memory device may implement a selection procedure to select one or more targeted memory cells on one or more memory tiles as part of a write operation or other operation. For example, a targeted memory cell may be located at an intersection of a selected word line and a selected bit line). Other word lines may be referred to as deselected word lines. In some examples, the memory device may select a targeted memory cell by applying a first voltage pulse to the memory cell. Applying the first voltage pulse may include bringing the selected word line to a lower voltage, maintaining deselected word lines at a constant voltage, and ramping the voltage of the selected bit line from a lower voltage to a first, intermediate voltage for a period of time. In some cases, the application of the constant voltage to the deselected word lines may prevent selection of untargeted memory cells, which may prevent current leakage from the selected bit line during the first voltage pulse. The prevention of current leakage may allow a stronger current to reach the targeted memory cell and may result in selection of the targeted memory cell. If the targeted memory cell is selected, it may "snap," or produce a snapback event after application of the first voltage pulse, which may be detected by the memory device. If at any time the targeted memory cell is selected and a snapback event is detected, the memory device may proceed with a write operation (e.g., or other operation) on the selected memory cell.

The memory device may not detect a snapback event and may determine that the targeted memory cell is not selected. The memory device may apply a second voltage pulse to the selected bit line. Accordingly, the memory device may raise the selected bit line to a second, higher voltage for a period of time, which may be referred to as the second voltage pulse. In some cases, the memory device may apply a different voltage, higher than the constant voltage, to the deselected word lines to prevent current leakage. In some cases, the second voltage pulse may result in selection of the targeted memory cell and may produce a snapback event. In other cases, applying the second voltage pulse may not result in selection of the targeted memory cell. For example, current leakage may occur along the selected bit line, and the current reaching the targeted memory cell may be smaller than a current used to select the cell. In some examples, current leakage may occur based on a number of memory tiles sharing the voltage applied to the deselected word lines, which may limit the voltage.

In cases where the targeted memory cell is not selected by the second voltage pulse, the memory device may apply a third voltage pulse by raising the selected bit line to the second voltage for a period of time, following the application of the second voltage pulse. The memory device may also apply a voltage to the deselected word lines during the third voltage pulse to prevent current leakage. In some cases, the memory device may apply the voltage for the deselected word lines to memory tiles with memory cells that have not yet been selected, where the number of memory tiles may be a smaller number of tiles than during the second pulse (e.g., because some memory cells may have been selected during the second pulse). Accordingly, more power may be available to apply a voltage to the deselected word lines and thus reduce current leakage. Such actions may increase a likelihood of selecting the target memory cell because some memory tiles may not be applying the third pulse and current leakage across the memory device may be reduced. In such cases, a sufficient current may reach the targeted memory cell during the third voltage pulse such that the memory device may select the targeted memory cell and write data to the targeted memory cell as part of the write operation.

Features of the disclosure are initially described in the context of a memory devices as described with reference to FIGS. 1-2. Features of the disclosure are described in the context of a memory device, graphs, and timing diagrams as described with reference to FIGS. 3-6. These and other features of the disclosure are further illustrated by and described with reference to an apparatus diagram and flowcharts that relate to memory cell selection as described with references to FIGS. 7-11.

FIG. 1 illustrates an example memory device 100 in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a memory cell. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing an access line for both as explained below. In some cases, the memory cells may be multi-level memory cells configured to store more than one bit of data using multi-level storage techniques. The memory device 100 may include multiple tiles 150 of memory cells 105, where each tile 150 may include multiple memory cells 105 (e.g., thousands or hundreds of memory cells 105) grouped together for one or more operations. A tile 150 of memory cells 105 may, for example, include any quantity of memory cells 105, and may be represented by a tile 150-a or a tile 150-b (e.g., each of which includes multiple memory arrays 103), among other examples (e.g., where a tile 150 may include one memory array 103 or less than one memory array 103 of memory cells 105).

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) with one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting word line 110 and bit line 115. In some examples, bit lines 115 may also be referred to as digit lines. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple bit lines 115, labeled BL_1 through BL_N, where M and N depend on the array size. Thus, by activating a word line 110 and a bit line 115, e.g., WL_2 and BL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a memory cell 105 may be programmed by providing an electric pulse to the cell, which may include a memory storage element. The pulse may be provided via a first access line (e.g., word line 110) or a second access line (e.g., bit line 115), or a combination thereof. In some cases, upon providing the pulse, ions may migrate within the memory storage element, depending on the polarity of the memory cell 105. Thus, a concentration of ions relative to the first side or the second side of the memory storage element may be based at least in part on a polarity of a voltage between the first access line and the second access line. In some cases, asymmetrically shaped memory storage elements may cause ions to be more crowded at portions of an element having more area. Certain portions of the memory storage element may have a higher resistivity and thus may give rise to a higher threshold voltage than other portions of the memory storage element. This description of ion migration represents an example of a mechanism of a self-selecting memory cell for achieving the results described herein. This example of a mechanism should not be considered limiting.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component may be associated either with column decoder or row decoder.

A memory cell 105 may be set or written by activating (e.g., selecting) the relevant word line 110 and bit line 115 and at least one logic value may be stored in the memory cell 105. Column decoder 130 or row decoder 120 may accept data, for example input/output 135, to be written to the memory cells 105. In some cases, a memory cell 105 may be written to store data after selecting the memory cell 105 by applying a first pulse, a second pulse, and a third pulse to the memory cell 105. This process is described in more detail below with reference to FIGS. 3-6.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to execute a select portion of a write operation that can program a memory cell. For example, the memory controller 140 may be configured to apply, during a select operation, a first pulse to the memory cell 105. In some examples, applying the first pulse may include applying a voltage to a first access line (e.g., to word line 110), a first voltage to a second access line (e.g., bit line 115), and a constant voltage to a set of access lines (e.g., unselected word lines 110). The memory controller 140 may be configured to detect a snapback event at the memory cell 105 in response to selecting the memory cell 105 after applying the first pulse. The snapback event may, for example, result in a reduced threshold voltage of the memory cell 105.

In some examples, the memory controller 140 may apply a second pulse to the memory cell 105 in response to failing to detect the snapback event (e.g., failing to select the memory cell 105). Applying the second pulse may include applying a second voltage to the second access line (e.g., to bit line 115) and a third voltage to the set of access lines (e.g., unselected word lines 110). The memory controller 140 may be configured to detect a snapback event at the memory cell 105 in response to applying the second pulse. In some examples, the memory controller 140 may apply a third pulse to the memory cell 105 in response to failing to detect the snapback event, in order to select the memory cell 105. Applying the third pulse may include applying the second voltage to the second access line (e.g., to bit line 115) and a fourth voltage to the set of access lines (e.g., unselected word lines 110).

In some examples, the memory controller 140 may be configured to perform a write operation on a selected memory cell 105. During the write operation, the memory controller 140 may apply different pulses having different polarities to the memory cell 105 to store a logic state in the memory cell 105. As described above, the logic state stored on the memory cell 105 may be detected during a snapback event. In such examples, the memory controller 140 may store a second logic state in the memory cell 105, where the second logic state may be different than the first logic state detected as being stored in the memory cell 105.

Figure 2:
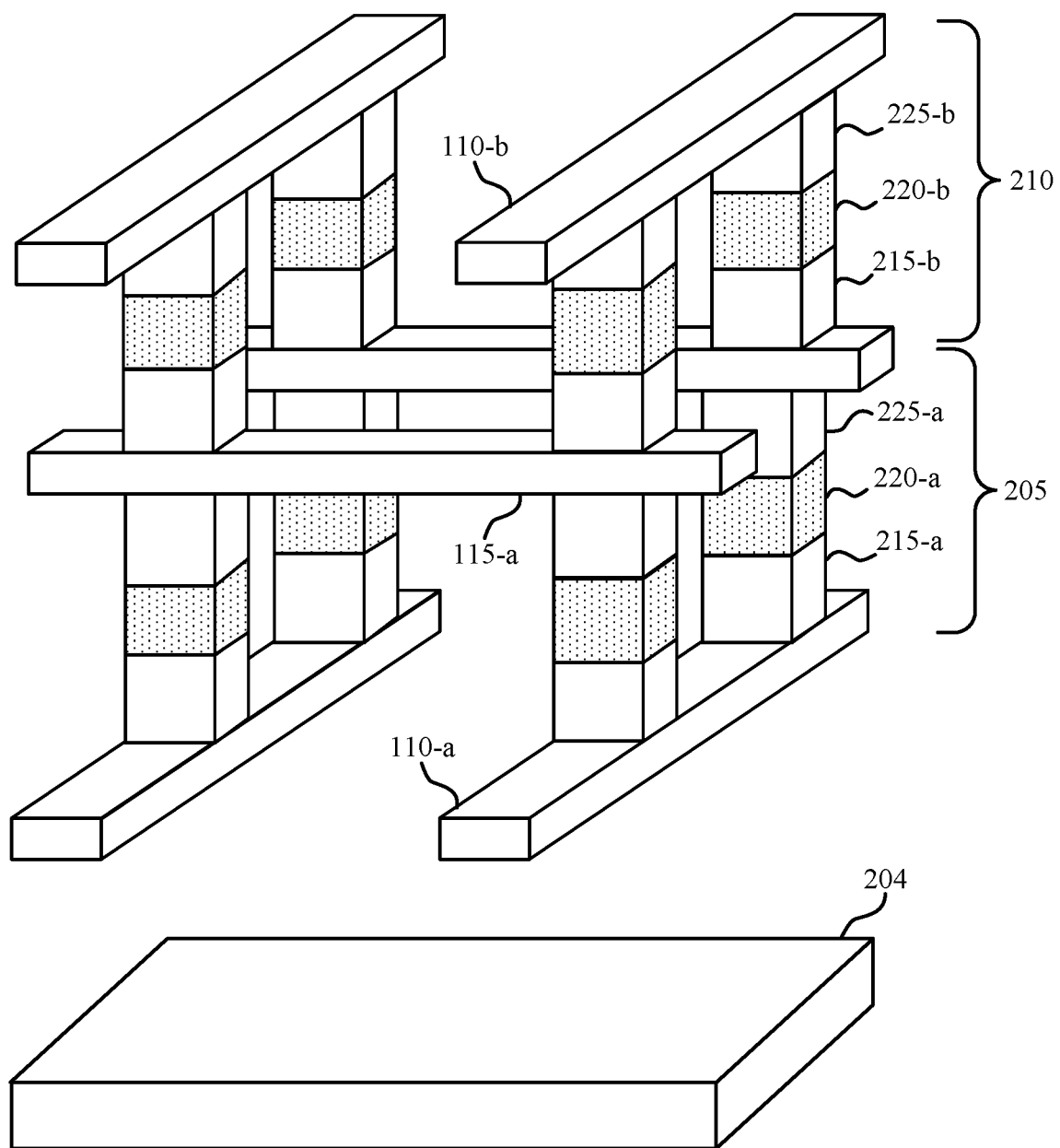
FIG. 2 illustrates an example of a memory device that supports memory cell selection in accordance with examples as disclosed herein.

FIG. 2 illustrates an example of a memory device 200 that supports memory cell selection in accordance with aspects of the present disclosure. Memory device 200 may be an example of portions of memory array 102 described with reference to FIG. 1. Memory device 200 may include a first array or deck 205 of memory cells that is positioned above a substrate 204 and second array or deck 210 of memory cells on top of the first array or deck 205. Memory device 200 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more memory cells (e.g., memory cell 220-*a* and memory cell 220-*b*, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-*a*, chalcogenide material 220-*a*, and second electrode 225-*a*. In addition, memory cells of the second deck 210 may include a first electrode 215-*b*, chalcogenide material 220-*b*, and second electrode 225-*b*. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled with bit line 115-*a* such that bit line 115-*a* is shared by vertically adjacent memory cells. In some cases, the memory cells 220 may be examples of phase-change memory cells or self-selecting memory cells.

The architecture of memory device 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a memory cell 220 including chalcogenide material may be programmed to a logic state during a write operation. By way of example, when a particular memory cell 220 is programmed, elements within the cell separate, causing ion migration. Ions may migrate towards a particular electrode, depending on the polarity of the pulse applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse. For example, if a memory cell has a given distribution of ions, the threshold voltage detected during the read operation may be different for a first read pulse with a first polarity than it is with a second read pulse having a second polarity. Depending on the polarity of the memory cell, this concentration of migrating ions may represent a logic "1" or logic "0" state. This description of ion migration represents an example of a mechanism of the memory cell for achieving the results described herein. This example of a mechanism should not be considered limiting.

Before programming, the memory cell 220 may be selected to perform the write operation. In some cases, a memory device (e.g., memory array, memory controller, etc.) may implement a selection procedure to select one or more targeted memory cells 220 on one or more memory tiles. For example, a targeted memory cell 220 may be located at an intersection of two access lines (e.g., a selected word line 110 and a selected bit line 115). Other word lines (e.g., additional to the selected word line) may be referred to as deselected word lines 110. In some examples, the memory device may select the targeted memory cell 220 by applying a first voltage pulse to the selected bit line 115, while maintaining deselected word lines 110 at a constant voltage. In some cases, the application of the constant voltage to the deselected word lines 110 may prevent selection of untargeted memory cells 220, which may prevent current leakage from the selected bit line 115 during the first voltage pulse. If the targeted memory cell 220 is selected, it may "snap," or produce a snapback event after application of the first voltage pulse, which may be detected by the memory device. If at any time the targeted memory cell 220 is selected and a snapback event is detected, the memory device may proceed with a write operation (e.g., or other operation) on the selected memory cell 220.

In some cases, the memory device may not detect a snapback event and may determine that the targeted memory cell 220 is not selected. Therefore, the memory device may apply a second voltage pulse to the selected bit line 115 while applying a different voltage, higher than the constant voltage, to the deselected word lines 110 to prevent current leakage. In some cases, applying the second voltage pulse may not result in selection of the targeted memory cell 220. For example, current leakage may occur along the selected bit line 115, where current leakage may occur based on a number of memory tiles sharing the voltage applied to the deselected word lines 110, which may limit the voltage.

To increase the probability of selecting the targeted memory cell 220, the memory device may apply a third voltage pulse to the selected bit line 115 and may apply a voltage to the deselected word lines 110 to prevent current leakage. In some cases, the memory device may apply the voltage for the deselected word lines 110 to memory tiles with memory cells 220 that have not yet been selected, where the number of memory tiles may be a smaller number of tiles than during the second pulse (e.g., because some memory cells 220 may have been selected during the second pulse). Accordingly, more power may be available to apply a voltage to the deselected word lines 110 and thus prevent current leakage. Therefore, in some cases, a sufficient current may reach the targeted memory cell 220 during the third voltage pulse, such that the memory device may select the targeted memory cell 220 and write data to the cell as part of the write operation.

Figure 3:
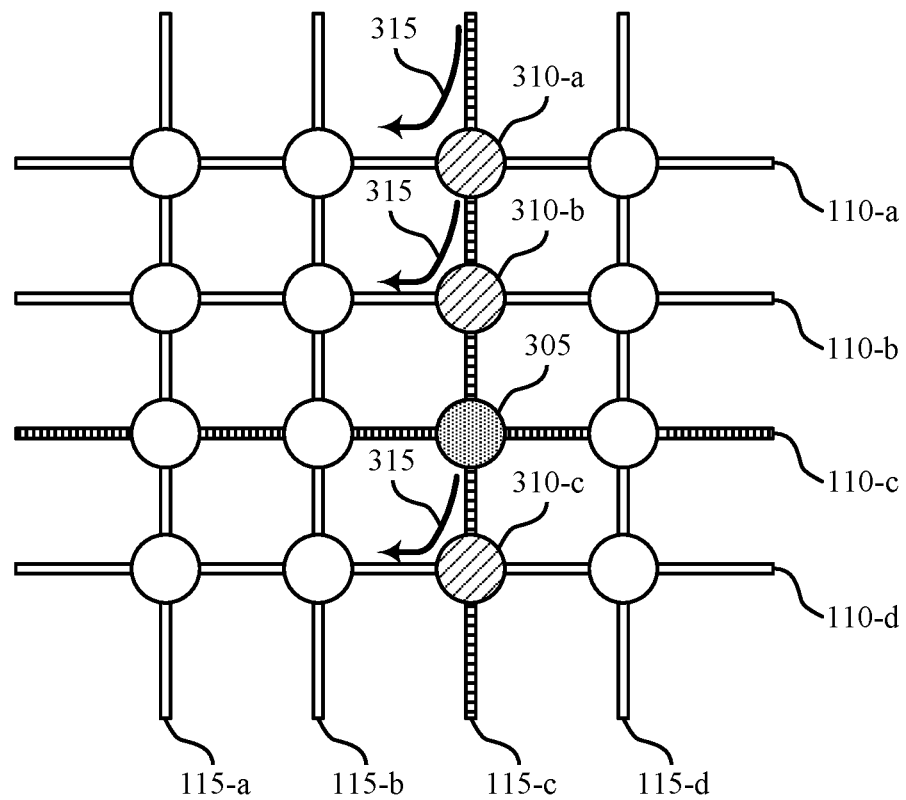
FIG. 3 illustrates an example of a memory device that supports memory cell selection in accordance with examples as disclosed herein.

FIG. 3 illustrates an example of a memory device 300 that supports memory cell selection in accordance with aspects of the present disclosure. Memory device 300 may include word lines 110, bit lines 115, and an array of memory cells (e.g., including memory cell 305 and memory cells 310). In some examples, memory device 300 may be an example of a cross-point architecture, a pillar architecture, or a planar architecture. Memory device 300 may be an example of memory device 200, as described with reference to FIG. 2. In some cases, memory device 300 may implement a memory cell selection procedure as part of a write operation, as described with reference to FIGS. 1 and 2.

The memory device 300 may implement a selection procedure to select one or more memory cells 305 on one or more memory tiles, where one memory cell 305 may be located at an intersection of a word line 110-c and a bit line 115-c. In some cases, word line 110-c and bit line 115-c may additionally or alternatively be referred to as selected word line 110-c and selected bit line 115-c. Other word lines 110

(e.g., word lines 110-*a*, 110-*b*, and 110-*d*) may be referred to as unselected word lines 110 or deselected word lines 110, while other bit lines 115 (e.g., bit lines 115-*a*, 115-*b*, and 115-*d*) may be referred to as unselected bit lines 115 or deselected bit lines 115.

In some examples, memory device 300 may select a memory cell 305 by bringing selected word line 110-*c* to a lower voltage, maintaining deselected word lines 110 at a constant voltage (e.g., constant bias), and ramping the voltage of bit line 115-*c* from a lower voltage (e.g., lower bias) to a first, intermediate voltage (e.g., intermediate bias) for a period of time, which may be referred to as a first voltage pulse. In some cases, the application of the constant voltage to deselected word lines 110 may prevent memory cells 310 from being selected during the voltage pulse (e.g., first voltage pulse) to bit line 115-*c*. For example, the constant voltage may reduce the bias across memory cells 310 such that may memory cells 310 may not be selected by the voltage pulse. Accordingly, the application of the constant voltage to deselected word lines 110 may prevent current leakage 315 from bit line 115-*c* during the first voltage pulse, where current leakage 315 may pass through memory cells 310 and along deselected word lines 110. The prevention of current leakage may allow a stronger current to reach memory cell 305, which may result in selection of memory cell 305.

In some cases, the first voltage pulse to bit line 115-*c* may result in selection of memory cell 305 (e.g., if memory cell 305 has a lower voltage threshold based on a stored logic state). Accordingly, if memory cell 305 is selected, memory cell 305 may "snap," or produce a snapback event described with reference to FIGS. 4A and 4B, after application of the first voltage pulse.

If memory cell 305 is selected and produces a snapback event, memory device 300 may detect the snapback event (e.g., via a dedicated circuit) and may determine that memory cell 305 is selected. Therefore, memory device 300 may proceed with a write operation that may include writing to selected memory cell 305. In some cases, applying the first voltage pulse to bit line 115-*c* may not result in selecting memory cell 305 or producing a related snapback event (e.g., if memory cell 305 has a higher voltage threshold based on a stored logic state). As such, memory device 300 may not detect the snapback event (e.g., via the dedicated circuit), may determine that memory cell 305 is not selected, and may determine to apply a second voltage pulse to bit line 115-*c*.

As part of applying the second voltage pulse, memory device 300 may raise bit line 115-*c* to a second, higher voltage (e.g., bias) for a period of time. During at least a portion of the second voltage pulse, memory device 300 may apply a different voltage, higher than the constant voltage, to unselected word lines 110 to prevent current leakage 315 along unselected word lines 110. In some cases, the second voltage pulse to bit line 115-*c* may result in selection of memory cell 305, and memory cell 305 may produce a snapback event, which may be detected by memory device 300 (e.g., via the dedicated circuit). As such, memory device 300 may proceed with a write operation that may include writing to selected memory cell 305.

In some cases, applying the second voltage pulse to bit line 115-*c* may not result in selecting memory cell 305, or producing a related snapback event. For example, current leakage 315 may occur along bit line 115-*c*, and the current reaching memory cell 305 may be smaller than a current used to select memory cell 305. In some examples, current leakage 315 may occur if a voltage applied to unselected word lines 110 is not sufficient to prevent memory cells 310 from being selected. In some cases, the voltage applied to unselected word lines 110 may be shared among one or more tiles selecting memory cells 305, which may limit the voltage applied to unselected word lines 110 in each tile. For example, a certain amount of total voltage may be available to memory device 300 for application to unselected word lines 110, which memory device 300 may share or split amongst tiles that are deselecting word lines 110. As such, some tiles selecting memory cells 305 may be unable to apply a voltage sufficient to prevent selection of memory cells 310, which may result in current leakage 315 from memory cells 310 and therefore in insufficient current to select memory cells 305. In one example, applying the voltage to reduce current leakage 315 may be effective at voltages greater than or equal to 400 millivolts (mV). Thus, memory tiles that apply a voltage greater than or equal to 400 mV to unselected word lines 110 may prevent current leakage 315.

In cases where memory cell 305 is not selected, memory device 300 may not detect the snapback event (e.g., via the dedicated circuit) and may determine that memory cell 305 is not selected. Some memory systems may increase the time for applying the second voltage pulse in order to solve this problem and select memory cell 305, but this method may be limited by the amount of current available to deliver to farther memory cells (e.g., memory cells at or near the end of a conductive path of a power-delivery network).

To increase the probability of selecting memory cell 305 during the selection procedure for all tiles, memory device 300 may apply a third voltage pulse by raising bit line 115-*c* to the second voltage for a period of time following the application of the second voltage pulse. Memory device 300 may also apply a voltage to unselected word lines 110 during the third voltage pulse to prevent current leakage 315 along unselected word lines 110. In some cases, memory device 300 may apply the voltage for unselected word lines 110 to memory tiles with memory cells 305 that have not yet been selected, where the number of memory tiles may be a smaller number of tiles than during the second pulse (e.g., because some memory cells 305 may have been selected during the second pulse). Accordingly, more power may be available to memory device 300 to apply a voltage to unselected word lines 110 and thus prevent current leakage 315. Therefore, in some cases, a sufficient current may reach memory cell 305 during the third voltage pulse such that memory device 300 may select memory cell 305 and write data to memory cell 305 as part of the write operation.

In some cases, the application of the third pulse may reduce a bit error rate associated with memory cell 305, particularly if memory cell 305 is located farther from a power source of memory device 300. For example, the third pulse may select memory cell 305 in cases where the first pulse and the second pulse may have failed to do so. As such, memory device 300 may write data to memory cell 305 as part of the write operation and the bit error rate associated with memory cell 305 may be reduced.

Figure 4A:
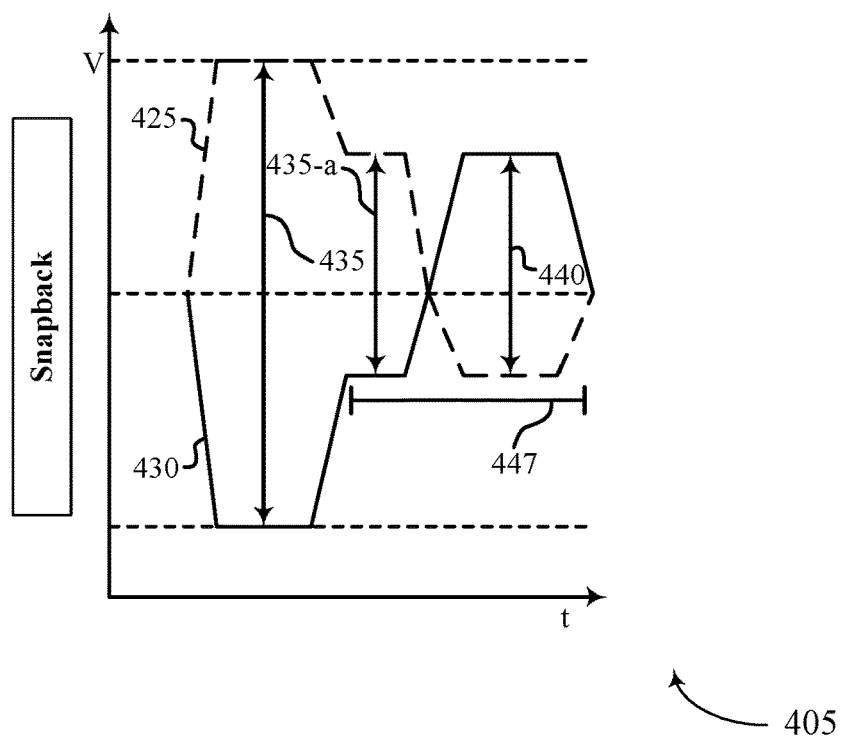
FIGS. 4A and 4B illustrate examples of timing diagrams that support memory cell selection in accordance with examples as disclosed herein.
Figure 4B:
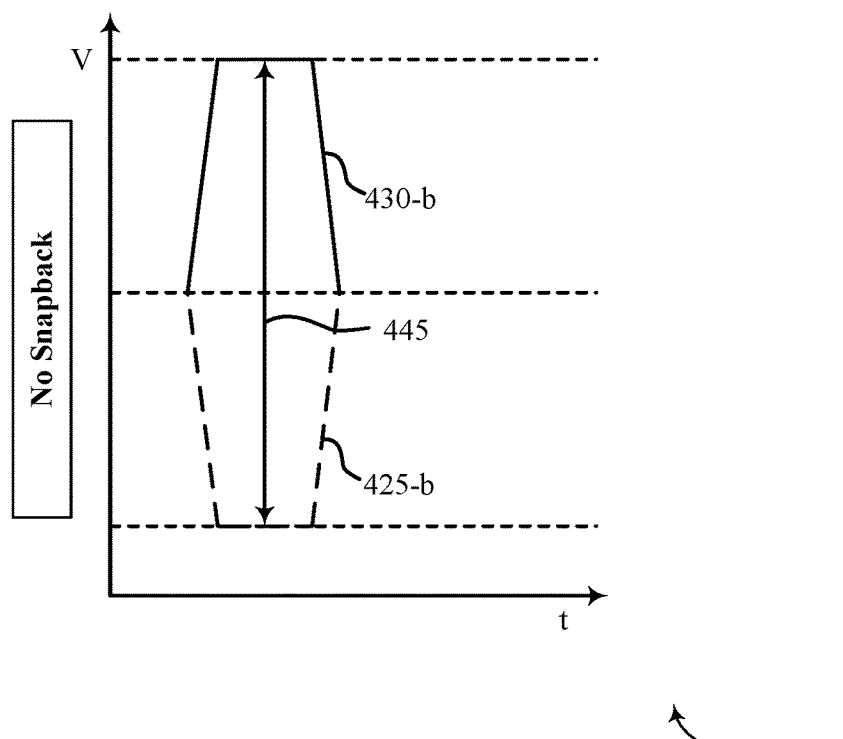

FIGS. 4A and 4B illustrate examples of a timing diagrams 405 and 410 that support memory cell selection in accordance with examples of the present disclosure. A memory cell may be configured to store a particular logic state based on one or more pulses applied to the cell. A voltage threshold the memory cell may depict logic states that may be stored in the memory cell.

Memory cells may include a chalcogenide material as described with reference to FIGS. 1 and 2. A threshold voltage may represent various logic states of a memory cell during a write operation, such as during a select portion of a write operation. By applying a voltage pulse to the memory cell, a snapback event may occur. The snapback event may be characterized by a reduction in the threshold voltage associated with logic state. Stated another way, by applying the first pulse to the memory cell, the threshold voltage associated with logic state may shift (e.g., towards a zero voltage). When the snap event occurs, the threshold voltage may shift closer to zero voltage for a duration. After the sudden movement, the threshold voltage may relax back to an original position.

Timing diagram 405 of FIG. 4A may depict a write operation of a memory cell. Timing diagram 405 may show a first pulse (e.g. represented by a voltage difference between access lines). Timing diagram 405 may also depict the voltage 425 of an access line (e.g., bit line 115 as described with reference to FIG. 1), and the voltage 430 of an access line measured from a ground (e.g., word line 110 as described with reference to FIG. 1). In some cases, the first pulse 435 and/or its components voltages 425 and 430 may represent any of the first pulse, second pulse, or third pulse described with reference to FIG. 3. To conduct a select operation on a memory cell, a first voltage 425 may be applied to one access line and a second voltage 430 may be applied to a second access line.

A memory cell associated with timing diagram 405 may store a first logic state (e.g., a logic "0"). As described above with reference to FIG. 3, to write a second logic state (e.g., a logic "1") to the memory cell, a first pulse 435 may be applied to the memory cell. The first pulse 435 may be configured such that a snapback event occurs if the memory cell selected but that no snapback event occurs if the memory cell is not selected. In some cases, a snapback event may occur if an amount current reaches the memory cell, where the amount of current needed to cause snapback may be based on a voltage threshold of the memory cell (e.g., associated with the logical state stored in the memory cell).

After applying the first pulse 435, a snapback event may occur which may be characterized by the threshold voltage of the memory cell being reduced. In some examples the snapback event may be detected by a memory controller (e.g., memory controller 140 as described with reference to FIG. 1) or a dedicated circuit. The snapback event may cause the threshold voltage associated with the memory cell to be reduced. In some cases, the snapback event may cause the magnitude of the first pulse to be reduced, as shown by the first pulse 435-*a*.

A snapback event may occur for a fixed duration, and may be followed by a period in which the memory cell is maintained in a higher conductance state (e.g., duration 447). This high conductance state may be referred to as a selection time. To write a logic value (e.g., a logic "1") to the memory cell, a second pulse 440 may be applied.

In some examples, the second pulse 440 may not be applied during the selection time, or duration 447 (e.g., because no snapback event is detected and/or the cell is not selected for the write operation). Accordingly, a threshold voltage of the memory cell may increase to its original level. For example, in the context of timing diagram 405, if second pulse 440 were not applied during duration 447, a threshold voltage of the memory cell may increase to the voltage value depicted prior to duration 447. In some examples, the memory cell may be selected after duration 447 by applying a voltage higher than the original threshold voltage of the memory cell. For example, a voltage pulse may be applied similar to the second pulse or the third pulse described with reference to FIG. 3.

Timing diagram 410 of FIG. 4B may depict a portion of a write operation of a memory cell, such as a selection portion of a write operation. Timing diagram 410 may show a first pulse 445 being applied to the memory cell, which may be an example of the first pulse or the second pulse described with reference to FIG. 3. Timing diagram 410 may also depict the voltage 430-*b* of an access line (e.g., bit line 115 as described with reference to FIG. 1), and the voltage 425-*b* of a second access line (e.g., word line 110).

A memory cell associated with timing diagram 410 may store a logic state (e.g., a logic "0"). As described above with reference to FIG. 3, to write a logic state (e.g., a logic "0") to the memory cell, a first pulse 445 may be applied to the memory cell. Accordingly, first pulse 445 may be applied to the cell. As described above, when a memory cell stores a first logic state (e.g., a logic "1"), a snapback event may occur when a pulse is applied to the memory cell as part of a write operation.

If a sufficient amount of current does not reach the memory cell during the first pulse, a snapback event may not occur. Accordingly, as illustrated in timing diagram 410, a snapback event does not occur and the write operation (e.g., the attempted write operation) may continue to apply one or more other pulses to attempt to select the memory cell and detect a snapback event. For example, a voltage pulse may be applied similar to the second pulse or the third pulse described with reference to FIG. 3. The lack of an occurrence of the snapback event may be detected by not seeing a reduction in the magnitude of the first pulse 445 (e.g., at a memory controller or a dedicated circuit).

Figure 5:
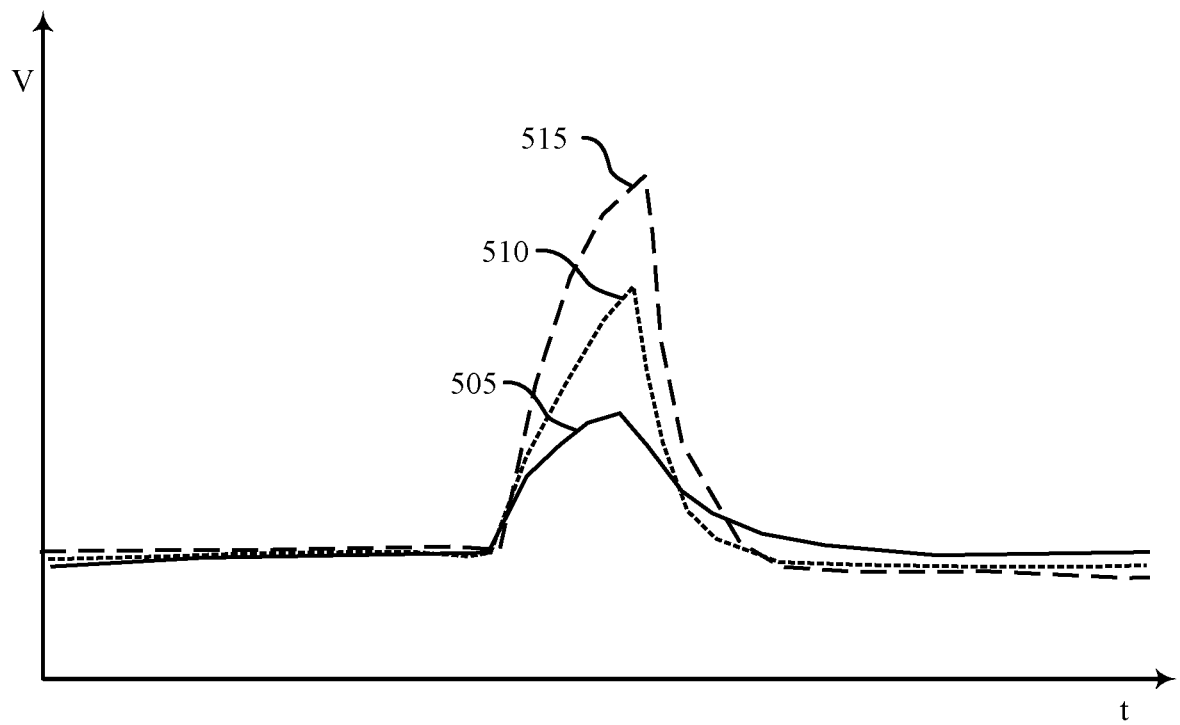
FIG. 5 illustrates an example of a graph that supports memory cell selection in accordance with examples as disclosed herein.

FIG. 5 illustrates an example of a graph 500 that supports memory cell selection in accordance with examples as disclosed herein. Graph 500 may include examples of voltages applied to one or more deselected word lines, as described with reference to FIG. 3. In some cases, graph 500 may represented voltages applied in a memory device, such as memory devices 200 or 300 described with reference to FIGS. 2 and 3, respectively. In some examples, the voltages depicted in graph 500 may be applied during a selection procedure as part of a write operation, as described with reference to FIGS. 1-3.

Graph 500 may represent a voltage 515 applied to one or more deselected word lines when deselecting word lines on a lower number of tiles simultaneously (e.g., one tile). Similarly, graph 500 may represent voltages 510 and 505 applied to one or more deselected word lines when deselecting word lines on an intermediate number of tiles (e.g., 16 tiles) and a higher number of tiles (e.g., 128 tiles), respectively. In some cases, the voltage applied to deselected word lines may be shared among one or more tiles selecting memory cells, which may limit the voltage applied to deselected word lines in each tile. For example, a certain amount of total voltage may be available to the memory device for application to deselected word lines, which voltage the memory device may share or split amongst tiles that are deselecting word lines.

For example, as described above with reference to FIG. 3, voltage applied to one or more deselected word lines may be power delivery limited, such that applying the voltage to a higher number of tiles (e.g., sharing the voltage between the higher number of tiles) may reduce the voltage delivered to the deselected word lines in each tile. For example, voltage 515 may represent a higher voltage that may be applied to deselected word lines when deselecting word lines on a lower number of tiles simultaneously (e.g., one tile). Similarly, voltage 510 may represent an intermediate voltage that may be applied to deselected word lines when deselecting word lines on an intermediate number of tiles simultaneously (e.g., 16 tiles). Additionally, voltage 505 may represent a lower voltage that may be applied to deselected word lines when deselecting word lines on a higher number of tiles simultaneously (e.g., 128 tiles).

In some cases, applying a lower voltage to deselected word lines may cause one or more targeted memory cells to remain unselected during one or more pulses of a select portion of a write operation, as described with reference to FIG. 3 (e.g., due to current leakage along deselected word lines). Accordingly, a memory device may apply an additional (e.g., third) pulse during the select operation while supplying a voltage to deselected word lines. In some cases, the voltage may be applied to deselected word lines within sections where the one or more targeted memory cells remain unselected. As such, the amount of tiles using the deselection voltage may decrease and the voltage available to apply to the deselected word lines may increase. An increase in the voltage supplied to the deselected word lines may result in less current leakage along the deselected word lines and in selection of the one or more unselected targeted memory cells.

In one example, a memory device may apply a first and a second pulse to multiple bit lines in order to select targeted memory cells on a higher number of tiles. During the second pulse, the device may apply a voltage 505 to deselected word lines on the number of tiles. In some cases, some of the targeted memory cells may be selected and some may not be selected (e.g., because of current leakage along deselected word lines). Accordingly, the device may apply a third pulse to the bit lines in order to select any unselected target cells (e.g., on a smaller number of tiles) and may apply a voltage 510 to deselected word lines on the smaller number of tiles. In some cases, voltage 510 may be applied to word lines in tiles containing unselected target cells and not to word lines in other tiles, resulting in a higher available voltage 510 to apply to the deselected word lines. An increase in voltage supplied to the deselected word lines may result in less current leakage along the deselected word lines and a selection of the one or more unselected targeted memory cells.

In a second example, a memory device may apply a first and a second pulse to multiple bit lines in order to select targeted memory cells on a higher number of tiles. During the second pulse, the device may apply a voltage 505 to deselected word lines on the number of tiles. In some cases, some of the targeted memory cells may be selected and some may not be selected (e.g., because of current leakage along deselected word lines). Accordingly, the device may apply a third pulse to the bit lines in order to select any unselected target cells (e.g., on a smaller number of tiles) and may apply a voltage 515 to deselected word lines on the smaller number of tiles. In some cases, voltage 515 may be applied to word lines in tiles containing unselected target cells and not to word lines in other tiles, resulting in a higher available voltage 515 to apply to the deselected word lines. An increase in voltage supplied to the deselected word lines may result in less current leakage along the deselected word lines and a selection of the one or more unselected targeted memory cells.

Figure 6:
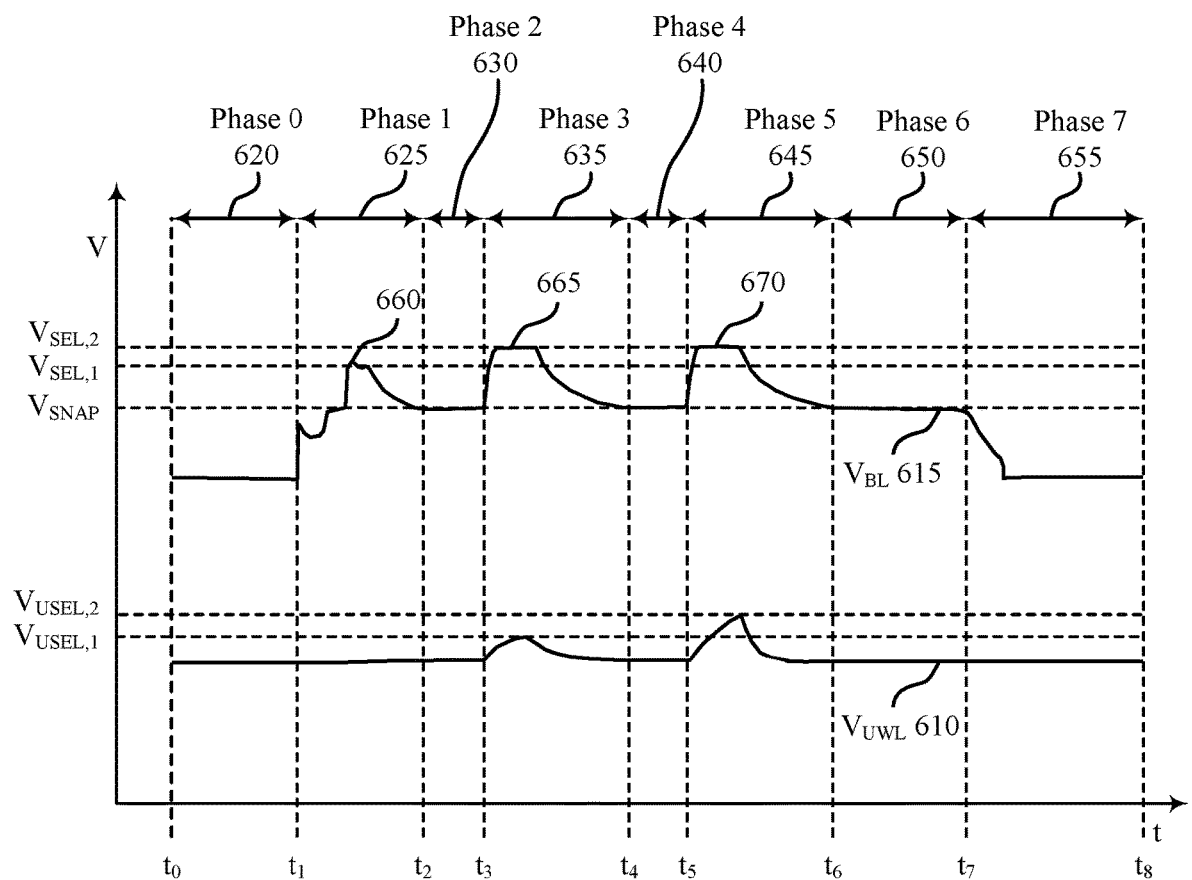
FIG. 6 illustrates an example of a timing diagram that supports memory cell selection in accordance with examples as disclosed herein.

FIG. 6 illustrates an example of a timing diagram 600 that supports memory cell selection in accordance with examples as disclosed herein. The timing diagram 600 illustrates procedures during a write operation, such as a select portion of a write operation. The select operation may correspond to a time period between t1 and t7 that includes a first phase 625 through a sixth phase 650. The write operation may correspond to a time period between t7 and t8 that includes a seventh phase 655. The timing diagram 600 shows various voltage levels associated with the components of the memory device 300 described with reference to FIG. 3, which may illustrate techniques for memory cell selection for one or more targeted memory cells in one or more memory tiles. Timing diagram may include a third voltage pulse 670 to increase the probability of selecting a targeted memory cell. The timing diagram 600 includes a voltage applied to the selected bit line 115-c (e.g., bit line voltage (VBL) 615) and a voltage applied to the unselected word lines 110 (e.g., unselected word line voltage (VUWL) 610), where the selected bit line 115-c, and the unselected word lines 110 may correspond to portions of the memory device 300.

During an initial phase 620 (e.g., beginning at t0), which may also be referred to as an idle period, the selected bit line 115-c and the unselected word lines 110 may be kept at a constant voltages. In other words, VUWL 610 and VBL 615 may be kept at a constant voltages. In some cases, the constant voltages may be zero volts, a positive voltage, or a negative voltage, and the constant voltages may be different for VUWL 610 and VBL 615. The initial phase may represent a time before the beginning of the write operation and the corresponding select operation.

At t1, the first phase 625, which may include a first voltage pulse 660, may begin. The VUWL 610 may be maintained at a constant voltage (e.g., a same constant voltage as during initial phase 620) in order to prevent selection of un-targeted memory cells and a corresponding current leakage along unselected word lines 110, as described with reference to FIG. 3. The VBL 615 may be ramped up (e.g., using a staircase voltage ramp) from the constant voltage of initial phase 620 to a first, intermediate voltage (e.g., first selection voltage (VSEL,1)) for a period of time, which may be referred to as the first voltage pulse 660. The VBL 615 may be allowed to settle back down to a lower voltage, snap voltage (VSNAP), in order to detect selected memory cells using a snapback detection process. In some cases, the first voltage pulse 660 may result in selection of the targeted memory cell (e.g., if the targeted memory cell has a lower voltage threshold based on its stored logic state). If the targeted memory cell is selected, it may "snap," or produce a snapback event discussed with reference to FIGS. 4A and 4B.

Accordingly, at t2, VBL 615 may reach VSNAP, and if the targeted memory cell is selected, memory device 300 may detect a snapback event (e.g., via a dedicated circuit) during a second phase 630 and may determine that the targeted memory cell is selected. In some cases, applying the first voltage pulse 660 may not select the targeted memory cell or produce a related snapback event (e.g., if the targeted memory cell has a higher voltage threshold based on its stored logic state). As such, memory device 300 may not detect the snapback event (e.g., via the dedicated circuit) during the second phase 630 and may determine to apply a second voltage pulse 665 to bit line 115-c during a third phase 635.

At t3, the third phase 635, which may include the second voltage pulse 665, may begin. The VUWL 610 may be raised to a voltage (e.g., first un-selection voltage (VUSEL,1)) in order to prevent selection of un-targeted memory cells and a corresponding current leakage along unselected word lines 110, as discussed with reference to FIG. 3. In some cases, VUSEL,1 may represent a voltage applied to unselected word lines 110 in one memory tile and may be representative of the voltage applied to unselected word lines 110 in one or more memory tiles containing targeted memory cells. The VBL 615 may be raised to a second voltage (e.g., second selection voltage (VSEL,2)) for a period of time, which may be referred to as the second voltage pulse 665. The VBL 615 may be allowed to settle back down to a lower voltage, VSNAP, in order to detect selected memory cells using a snapback detection process. In some cases, the second voltage pulse 665 may result in selection of the targeted memory cell. If the targeted memory cell is selected, it may "snap," or produce a snapback event discussed with reference to FIGS. 4A and 4B.

At t4, VBL 615 may relax to be at VSNAP, and if the targeted memory cell is selected, memory device 300 may detect a snapback event (e.g., via a dedicated circuit) during a fourth phase 640 and may determine that the targeted memory cell is selected. In some cases, applying the second voltage pulse 665 may not select the targeted memory cell or produce a related snapback event (e.g., if current leakage occurs). As such, memory device 300 may not detect the snapback event (e.g., via the dedicated circuit) during the fourth phase 640 and may determine to apply a third voltage pulse 670 to bit line 115-c during a fifth phase 645.

At t5, the fifth phase 645, which may include the third voltage pulse 670, may begin. The VUWL 610 may be raised to a voltage (e.g., second un-selection voltage (VUSEL,2)) in order to prevent selection of un-targeted memory cells and a corresponding current leakage along unselected word lines 110, as discussed with reference to FIG. 3. In some cases, VUSEL,2 may be applied to unselected word lines 110 in memory tiles containing targeted memory cells that have not yet been selected, where the number of memory tiles may be a smaller number of tiles than during the third phase 635 (e.g., because some targeted memory cells may have been selected during the third phase 635). Accordingly, more power may be available to apply to VUWL 610, and VUSEL,2 may be higher than VUSEL,1 and may prevent more current leakage during the fifth phase 645.

During the fifth phase 645, VBL 615 may be raised to the second voltage (e.g., second selection voltage (VSEL,2)) for a period of time, which may be referred to as the third voltage pulse 670. The VBL 615 may be allowed to settle back down to a lower voltage, VSNAP, to detect selected memory cells using a snapback detection process. In some cases, the second voltage pulse 665 may result in selection of the targeted memory cell. If the targeted memory cell is selected, it may "snap," or produce a snapback event discussed with reference to FIGS. 4A and 4B.

At t6, VBL 615 may reach VSNAP, and if the targeted memory cell is selected, memory device 300 may detect a snapback event during a sixth phase 650 and may determine that the targeted memory cell is selected. In some cases, a sufficient current may reach the targeted memory cell during the third voltage pulse 670 such that the targeted memory cell may be selected, reducing a bit error rate associated with the targeted memory cell.

Accordingly, at t7, the seventh phase 655 may include ending the selection operation and beginning a write operation to write data to the targeted memory cell and any other targeted memory cells in other memory tiles.

Figure 7:
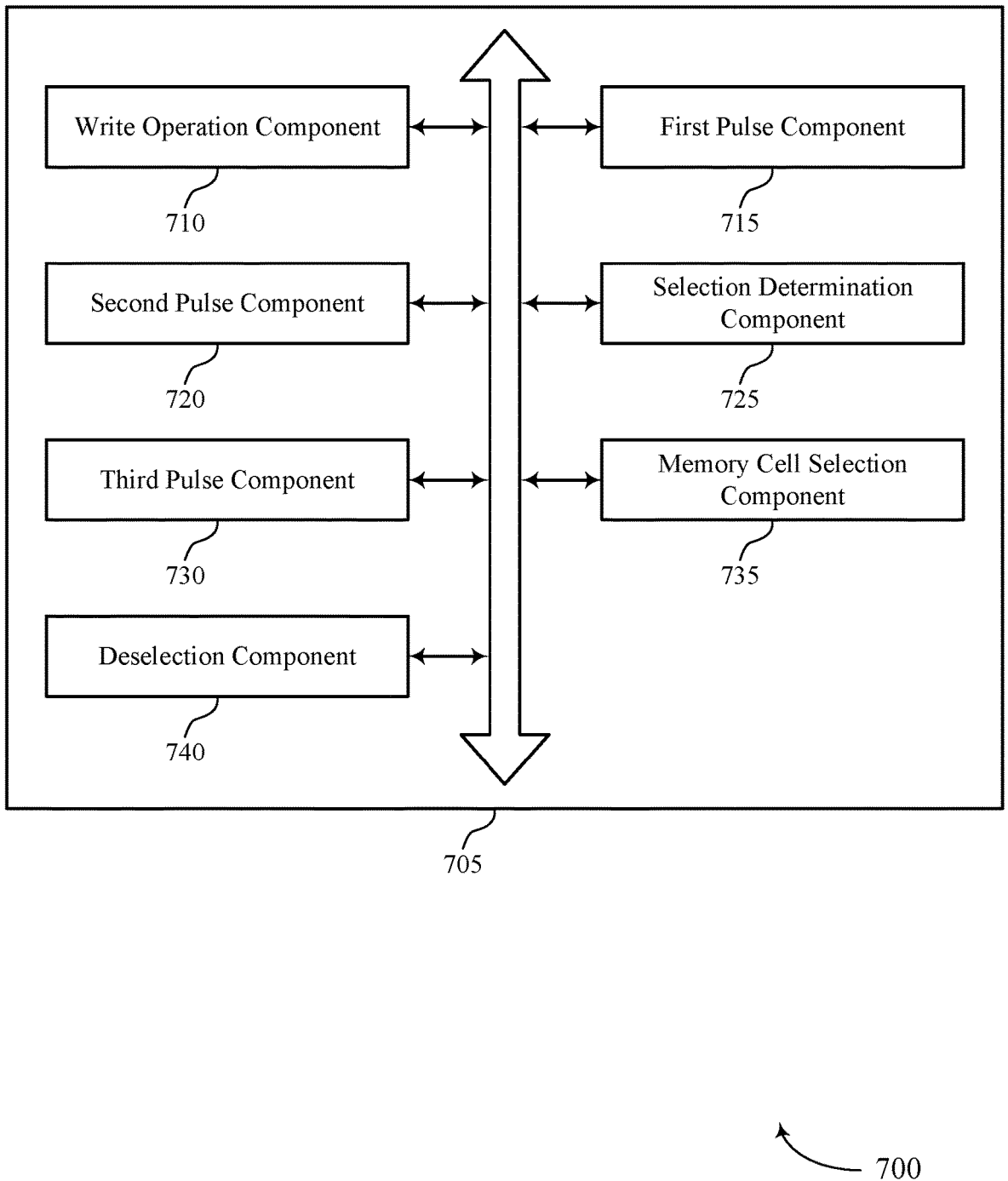
FIG. 7 shows a block diagram of a memory device that supports memory cell selection in accordance with examples as disclosed herein.

FIG. 7 shows a block diagram 700 of a memory device 705 that supports memory cell selection in accordance with examples as disclosed herein. The memory device 705 may be an example of aspects of a memory device as described with reference to FIGS. 1-3. The memory device 705 may include a write operation component 710, a first pulse component 715, a second pulse component 720, a selection determination component 725, a third pulse component 730, a memory cell selection component 735, and a deselection component 740. Each of these modules may communicate, directly or indirectly, with one another (e.g., via one or more buses).

The write operation component 710 may write a logic state to the memory cell based on selecting the memory cell for the write operation.

The first pulse component 715 may apply, to a memory cell including a chalcogenide material, a first pulse during a selection procedure of a write operation, the first pulse having a first voltage.

The second pulse component 720 may apply, to the memory cell based on applying the first pulse, a second pulse having a second voltage higher than the first voltage.

The selection determination component 725 may determine that the memory cell is unselected after applying the second pulse. In some examples, the selection determination component 725 may determine whether a snap back event occurs at the memory cell. In some examples, the selection determination component 725 may determine that the memory cell is unselected after applying the first pulse, where applying the second pulse is based on determining that the memory cell is unselected. In some examples, the selection determination component 725 may determine whether a snap back event occurs at the memory cell.

The third pulse component 730 may apply, to the memory cell based on determining that the memory cell is unselected after applying the second pulse, a third pulse having the second voltage. In some cases, the third pulse reduces a bit error rate of the memory cell. In some cases, a memory device includes a set of tiles, the memory cell being part of a first tile of the set. In some cases, a first quantity of tiles that applies the second pulse during the selection procedure is greater than a second quantity of tiles that applies the third pulse during the selection procedure.

The memory cell selection component 735 may select the memory cell for the write operation based on applying the first pulse, the second pulse, and the third pulse to the memory cell.

The deselection component 740 may deselect a second memory cell during at least a portion of the third pulse, the memory cell coupled with a digit line and the second memory cell coupled with the digit line. In some examples, the deselection component 740 may apply a fourth pulse to a word line coupled with the second memory cell, the fourth pulse having a third voltage configured to reduce a voltage difference across the second memory cell during the portion of the third pulse.

Figure 8:
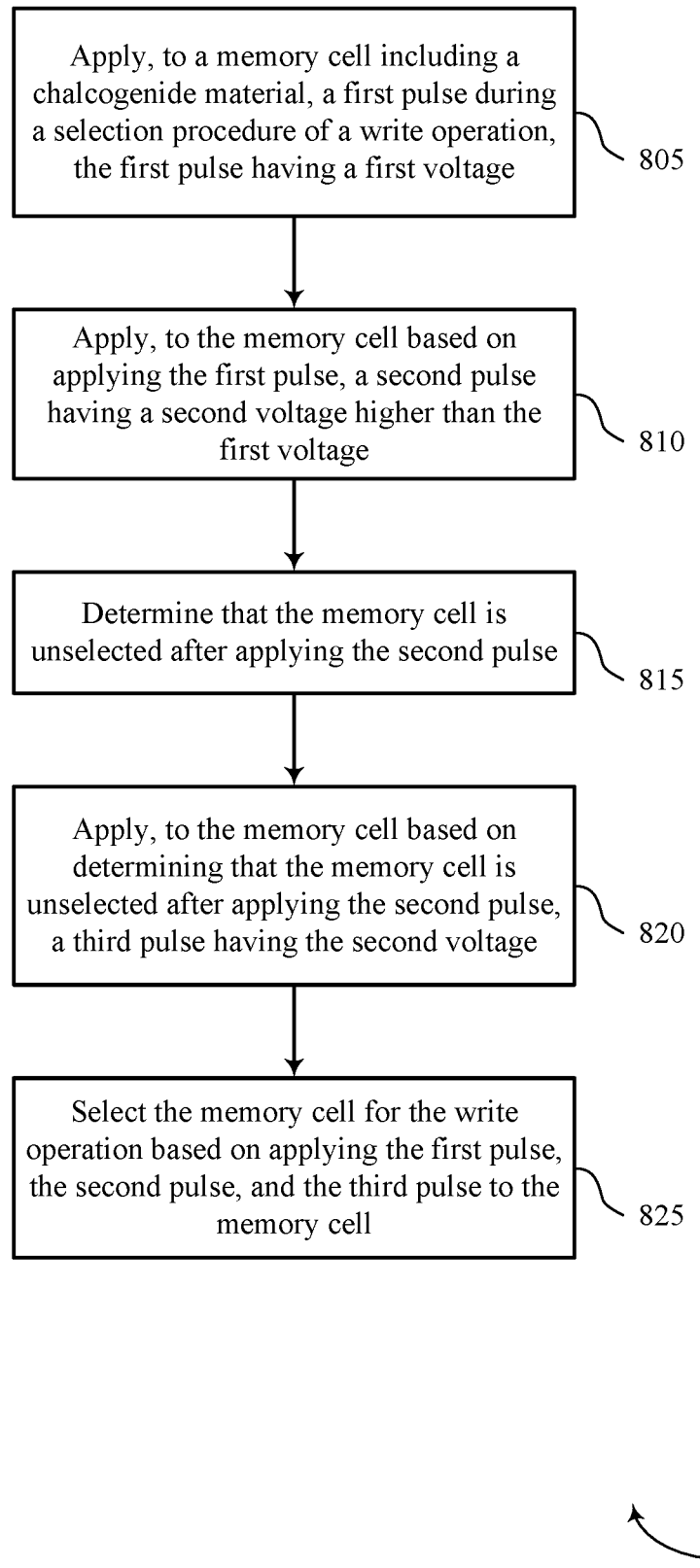
FIGS. 8 through 10 show flowcharts illustrating a method or methods that support memory cell selection in accordance with examples as disclosed herein.

FIG. 8 shows a flowchart illustrating a method or methods 800 that supports memory cell selection in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may apply, to a memory cell including a chalcogenide material, a first pulse during a selection procedure of a write operation, the first pulse having a first voltage. The operations of 805 may be performed according to the methods described herein. In some examples, aspects of the operations of 805 may be performed by a first pulse component as described with reference to FIG. 7.

At 810, the memory device may apply, to the memory cell based on applying the first pulse, a second pulse having a second voltage higher than the first voltage. The operations of 810 may be performed according to the methods described herein. In some examples, aspects of the operations of 810 may be performed by a second pulse component as described with reference to FIG. 7.

At 815, the memory device may determine that the memory cell is unselected after applying the second pulse. The operations of 815 may be performed according to the methods described herein. In some examples, aspects of the operations of 815 may be performed by a selection determination component as described with reference to FIG. 7.

At 820, the memory device may apply, to the memory cell based on determining that the memory cell is unselected after applying the second pulse, a third pulse having the second voltage. The operations of 820 may be performed according to the methods described herein. In some examples, aspects of the operations of 820 may be performed by a third pulse component as described with reference to FIG. 7.

At 825, the memory device may select the memory cell for the write operation based on applying the first pulse, the second pulse, and the third pulse to the memory cell. The operations of 825 may be performed according to the methods described herein. In some examples, aspects of the operations of 825 may be performed by a memory cell selection component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for applying, to a memory cell including a chalcogenide material, a first pulse during a selection procedure of a write operation, the first pulse having a first voltage, applying, to the memory cell based on applying the first pulse, a second pulse having a second voltage higher than the first voltage, determining that the memory cell is unselected after applying the second pulse, applying, to the memory cell based on determining that the memory cell is unselected after applying the second pulse, a third pulse having the second voltage, and selecting the memory cell for the write operation based on applying the first pulse, the second pulse, and the third pulse to the memory cell.

In some examples of the method 800 and the apparatus described herein, determining that the memory cell may be unselected further may include operations, features, means, or instructions for determining whether a snap back event occurs at the memory cell.

Some examples of the method 800 and the apparatus described herein may further include operations, features, means, or instructions for deselecting a second memory cell during at least a portion of the third pulse, the memory cell coupled with a digit line and the second memory cell coupled with the digit line.

In some examples of the method 800 and the apparatus described herein, deselecting the second memory cell further may include operations, features, means, or instructions for applying a fourth pulse to a word line coupled with the second memory cell, the fourth pulse having a third voltage configured to reduce a voltage difference across the second memory cell during the portion of the third pulse.

In some examples of the method 800 and the apparatus described herein, the third pulse reduces a bit error rate of the memory cell.

Some examples of the method 800 and the apparatus described herein may further include operations, features, means, or instructions for writing a logic state to the memory cell based on selecting the memory cell for the write operation.

In some examples of the method 800 and the apparatus described herein, a memory device includes a set of tiles, the memory cell being part of a first tile of the set, and a first quantity of tiles that applies the second pulse during the selection procedure may be greater than a second quantity of tiles that applies the third pulse during the selection procedure.

Some examples of the method 800 and the apparatus described herein may further include operations, features, means, or instructions for determining that the memory cell may be unselected after applying the first pulse, where applying the second pulse may be based on determining that the memory cell may be unselected.

In some examples of the method 800 and the apparatus described herein, determining that the memory cell may be unselected further may include operations, features, means, or instructions for determining whether a snap back event occurs at the memory cell.

Figure 9:
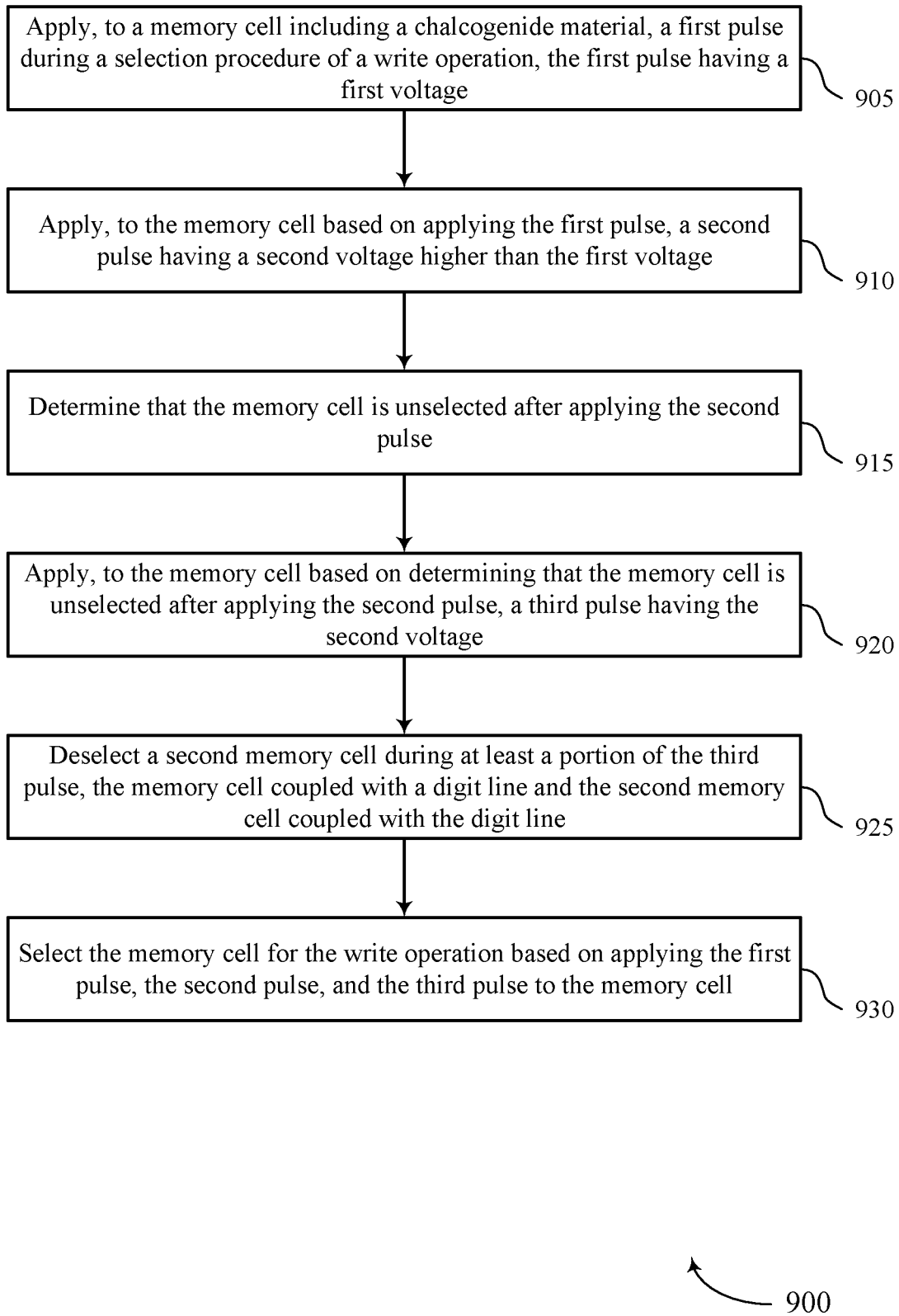

FIG. 9 shows a flowchart illustrating a method or methods 900 that supports memory cell selection in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may apply, to a memory cell including a chalcogenide material, a first pulse during a selection procedure of a write operation, the first pulse having a first voltage. The operations of 905 may be performed according to the methods described herein. In some examples, aspects of the operations of 905 may be performed by a first pulse component as described with reference to FIG. 7.

At 910, the memory device may apply, to the memory cell based on applying the first pulse, a second pulse having a second voltage higher than the first voltage. The operations of 910 may be performed according to the methods described herein. In some examples, aspects of the operations of 910 may be performed by a second pulse component as described with reference to FIG. 7.

At 915, the memory device may determine that the memory cell is unselected after applying the second pulse. The operations of 915 may be performed according to the methods described herein. In some examples, aspects of the operations of 915 may be performed by a selection determination component as described with reference to FIG. 7.

At 920, the memory device may apply, to the memory cell based on determining that the memory cell is unselected after applying the second pulse, a third pulse having the second voltage. The operations of 920 may be performed according to the methods described herein. In some examples, aspects of the operations of 920 may be performed by a third pulse component as described with reference to FIG. 7.

At 925, the memory device may deselect a second memory cell during at least a portion of the third pulse, the memory cell coupled with a digit line and the second memory cell coupled with the digit line. The operations of 925 may be performed according to the methods described herein. In some examples, aspects of the operations of 925 may be performed by a deselection component as described with reference to FIG. 7.

At 930, the memory device may select the memory cell for the write operation based on applying the first pulse, the second pulse, and the third pulse to the memory cell. The operations of 930 may be performed according to the methods described herein. In some examples, aspects of the operations of 930 may be performed by a memory cell selection component as described with reference to FIG. 7.

Figure 10:
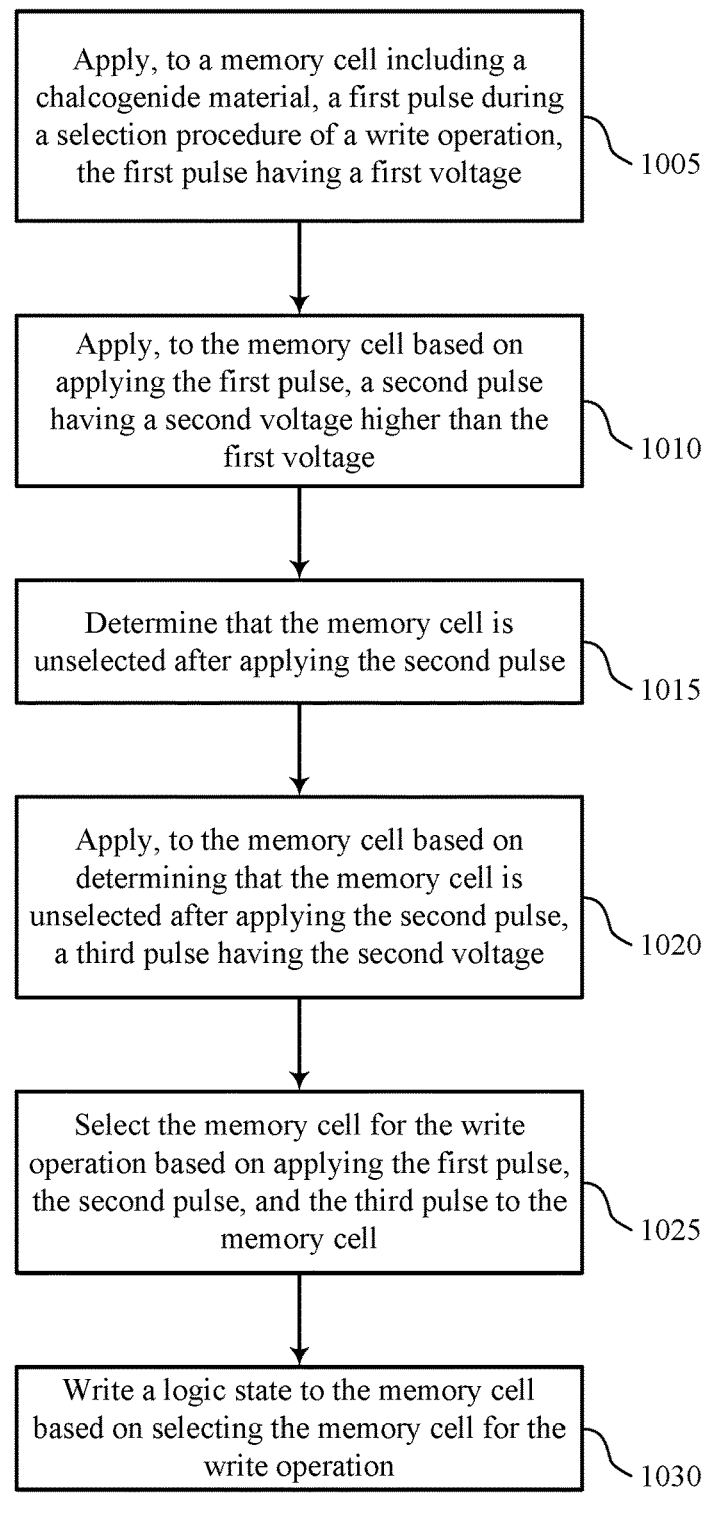

FIG. 10 shows a flowchart illustrating a method or methods 1000 that supports memory cell selection in accordance with aspects of the present disclosure. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may apply, to a memory cell including a chalcogenide material, a first pulse during a selection procedure of a write operation, the first pulse having a first voltage. The operations of 1005 may be performed according to the methods described herein. In some examples, aspects of the operations of 1005 may be performed by a first pulse component as described with reference to FIG. 7.

At 1010, the memory device may apply, to the memory cell based on applying the first pulse, a second pulse having a second voltage higher than the first voltage. The operations of 1010 may be performed according to the methods described herein. In some examples, aspects of the operations of 1010 may be performed by a second pulse component as described with reference to FIG. 7.

At 1015, the memory device may determine that the memory cell is unselected after applying the second pulse. The operations of 1015 may be performed according to the methods described herein. In some examples, aspects of the operations of 1015 may be performed by a selection determination component as described with reference to FIG. 7.

At 1020, the memory device may apply, to the memory cell based on determining that the memory cell is unselected after applying the second pulse, a third pulse having the second voltage. The operations of 1020 may be performed according to the methods described herein. In some examples, aspects of the operations of 1020 may be performed by a third pulse component as described with reference to FIG. 7.

At 1025, the memory device may select the memory cell for the write operation based on applying the first pulse, the second pulse, and the third pulse to the memory cell. The operations of 1025 may be performed according to the methods described herein. In some examples, aspects of the operations of 1025 may be performed by a memory cell selection component as described with reference to FIG. 7.

At 1030, the memory device may write a logic state to the memory cell based on selecting the memory cell for the write operation. The operations of 1030 may be performed according to the methods described herein. In some examples, aspects of the operations of 1030 may be performed by a write operation component as described with reference to FIG. 7.

It should be noted that the methods described above describe possible implementations, and that the operations and the steps may be rearranged or otherwise modified and that other implementations are possible. Further, portions from two or more of the methods may be combined.

An apparatus is described. The apparatus may include an array of memory cells for storing information and a controller coupled with the array of memory cells and configured to cause the apparatus to apply, to a memory cell including a chalcogenide material, a first pulse during a selection procedure of a write operation, the first pulse having a first voltage, apply, to the memory cell, a second pulse having a second voltage higher than the first voltage based on applying the first pulse, apply, to the memory cell, a third pulse having the second voltage based on applying the second pulse, and select the memory cell for the write operation based on applying the first pulse, the second pulse, and the third pulse to the memory cell.

Some examples may further include determining that the memory cell may be unselected after applying the second pulse, where applying the third pulse may be based on determining that the memory cell may be unselected. Some examples may further include determining whether a snap back event occurs at the memory cell. Some examples may further include deselect a second memory cell during at least a portion of the third pulse, the memory cell coupled with a digit line and the second memory cell coupled with the digit line.

Some examples may further include apply a fourth pulse to a word line coupled with the second memory cell, the fourth pulse having a third voltage configured to reduce a voltage difference across the second memory cell during the portion of the third pulse. In some examples, the third pulse reduces a bit error rate of the memory cell. Some examples may further include writing a logic state to the memory cell based on selecting the memory cell for the write operation.

In some examples, a memory device includes a set of tiles, the memory cell being part of a first tile of the set, and a first quantity of tiles that applies the second pulse during the selection procedure may be greater than a second quantity of tiles that applies the third pulse during the selection procedure. Some examples may further include determining that the memory cell may be unselected after applying the first pulse, where applying the second pulse may be based on determining that the memory cell may be unselected. Some examples may further include determining whether a snap back event occurs at the memory cell.

An apparatus is described. The apparatus may include a first tile of memory cells configured to apply, to a first memory cell of the first tile, a first pulse during a first duration of a selection procedure, determine that the first memory cell is unselected after applying the first pulse, apply, to the first memory cell, a second pulse during a second duration of the selection procedure based at least in part on determining that the first memory cell is unselected after applying the first pulse, determine that the first memory cell is selected after applying the second pulse, and write a first logic state to the first memory cell based at least in part on determining that the first memory cell is selected. The apparatus may include a second tile of memory cells configured to apply, to a second memory cell of the second tile, the first pulse during the first duration of the selection procedure, determine that the second memory cell is unselected after applying the first pulse, apply, to the second memory cell, the second pulse during the second duration of the selection procedure based on determining that the second memory cell is unselected after the first pulse, determine that the second memory cell is unselected after applying the second pulse, apply, to the second memory cell, a third pulse during a third duration of the selection procedure based on determining that the second memory cell is unselected after the second pulse, and write a second logic state to the second memory cell.

In some examples, the first pulse having a first voltage, the second pulse having a second voltage higher than the first voltage, and the third having the second voltage. Some examples may further include deselect a third memory cell of the second tile during at least a portion of the third duration associated with the third pulse, the second memory cell coupled with a digit line of the second tile and the third memory cell coupled with the digit line. In some examples, determining that the second memory cell may be unselected further may include operations, features, means, or instructions for determining whether a snap back event occurs at the second memory cell. In some examples, the memory cells of the first tile and the memory cells of the second tile include chalcogenide material.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory device or a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    applying, to a memory cell comprising a chalcogenide material, a first pulse during a selection procedure of a write operation, the first pulse having a first voltage;
    reducing a voltage applied to the memory cell from the first voltage to a third voltage after applying the first pulse;
    applying, to the memory cell based at least in part on applying the first pulse, a second pulse having a second voltage higher than the first voltage;
    reducing the voltage applied to the memory cell from the second voltage to the third voltage after applying the second pulse;
    determining that the memory cell is unselected after applying the second pulse and based at least in part on the third voltage;
    applying, to the memory cell based at least in part on determining that the memory cell is unselected after applying the second pulse, a third pulse having the second voltage; and
    selecting the memory cell for the write operation based at least in part on applying the first pulse, the second pulse, and the third pulse to the memory cell.

2. The method of claim 1, wherein determining that the memory cell is unselected further comprises:
    determining whether a snap back event occurs at the memory cell.

3. The method of claim 1, further comprising:
    deselecting a second memory cell during at least a portion of the third pulse, the memory cell coupled with a digit line and the second memory cell coupled with the digit line.

4. The method of claim 3, wherein deselecting the second memory cell further comprises:

applying a fourth pulse to a word line coupled with the second memory cell, the fourth pulse having a fourth voltage configured to reduce a voltage difference across the second memory cell during the portion of the third pulse.

5. The method of claim 1, further comprising:
writing a logic state to the memory cell based at least in part on selecting the memory cell for the write operation.

6. The method of claim 1, wherein:
a memory device comprises a plurality of tiles, the memory cell being part of a first tile of the plurality; and
a first quantity of tiles that applies the second pulse during the selection procedure is greater than a second quantity of tiles that applies the third pulse during the selection procedure.

7. The method of claim 1, further comprising:
determining that the memory cell is unselected after applying the first pulse, wherein applying the second pulse is based at least in part on determining that the memory cell is unselected.

8. The method of claim 7, wherein determining that the memory cell is unselected further comprises:
determining whether a snap back event occurs at the memory cell.

9. A method, comprising:
applying, to a memory cell comprising a chalcogenide material, a first pulse during a selection procedure of a write operation, the first pulse having a first voltage;
applying, to the memory cell based at least in part on applying the first pulse, a second pulse having a second voltage higher than the first voltage;
determining that the memory cell is unselected after applying the second pulse;
applying, to the memory cell based at least in part on determining that the memory cell is unselected after applying the second pulse, a third pulse having the second voltage; and
selecting the memory cell for the write operation based at least in part on applying the first pulse, the second pulse, and the third pulse to the memory cell, wherein the third pulse reduces a bit error rate of the memory cell.

10. An apparatus comprising:
an array of memory cells for storing information; and
a controller coupled with the array of memory cells and configured to cause the apparatus to:
apply, to a memory cell comprising a chalcogenide material, a first pulse during a selection procedure of a write operation, the first pulse having a first voltage;
reduce a voltage applied to the memory cell from the first voltage to a third voltage after applying the first pulse;
apply, to the memory cell, a second pulse having a second voltage higher than the first voltage based at least in part on applying the first pulse;
reduce the voltage applied to the memory cell from the second voltage to the third voltage after applying the second pulse;
apply, to the memory cell, a third pulse having the second voltage based at least in part on applying the second pulse; and
select the memory cell for the write operation based at least in part on applying the first pulse, the second pulse, and the third pulse to the memory cell.

11. The apparatus of claim 10, wherein the controller is configured to cause the apparatus to:
determine that the memory cell is unselected after applying the second pulse, wherein applying the third pulse is based at least in part on determining that the memory cell is unselected.

12. The apparatus of claim 11, wherein the controller is further configured to cause the apparatus to:
determine whether a snap back event occurs at the memory cell.

13. The apparatus of claim 10, wherein the controller is configured to cause the apparatus to:
deselect a second memory cell during at least a portion of the third pulse, the memory cell coupled with a digit line and the second memory cell coupled with the digit line.

14. The apparatus of claim 13, wherein the controller is further configured to cause the apparatus to:
apply a fourth pulse to a word line coupled with the second memory cell, the fourth pulse having a fourth voltage configured to reduce a voltage difference across the second memory cell during the portion of the third pulse.

15. The apparatus of claim 10, wherein the controller is configured to cause the apparatus to:
write a logic state to the memory cell based at least in part on selecting the memory cell for the write operation.

16. The apparatus of claim 10, wherein:
a memory device comprises a plurality of tiles, the memory cell being part of a first tile of the plurality; and
a first quantity of tiles that applies the second pulse during the selection procedure is greater than a second quantity of tiles that applies the third pulse during the selection procedure.

17. The apparatus of claim 10, wherein the controller is configured to cause the apparatus to:
determine that the memory cell is unselected after applying the first pulse, wherein applying the second pulse is based at least in part on determining that the memory cell is unselected.

18. The apparatus of claim 17, wherein the controller is further configured to cause the apparatus to:
determine whether a snap back event occurs at the memory cell.

19. An apparatus, comprising:
an array of memory cells for storing information; and
a controller coupled with the array of memory cells and configured to cause the apparatus to:
apply, to a memory cell comprising a chalcogenide material, a first pulse during a selection procedure of a write operation, the first pulse having a first voltage;
apply, to the memory cell, a second pulse having a second voltage higher than the first voltage based at least in part on applying the first pulse;
apply, to the memory cell, a third pulse having the second voltage based at least in part on applying the second pulse; and
select the memory cell for the write operation based at least in part on applying the first pulse, the second pulse, and the third pulse to the memory cell, wherein the third pulse reduces a bit error rate of the memory cell.

20. An apparatus, comprising:
a first tile of memory cells configured to:
  apply, to a first memory cell of the first tile, a first pulse during a first duration of a selection procedure;
  determine that the first memory cell is unselected after applying the first pulse;
  apply, to the first memory cell, a second pulse during a second duration of the selection procedure based at least in part on determining that the first memory cell is unselected after applying the first pulse;
  determine that the first memory cell is selected after applying the second pulse; and
  write a first logic state to the first memory cell based at least in part on determining that the first memory cell is selected; and
a second tile of memory cells configured to:
  apply, to a second memory cell of the second tile, the first pulse during the first duration of the selection procedure;
  determine that the second memory cell is unselected after applying the first pulse;
  apply, to the second memory cell, the second pulse during the second duration of the selection procedure based at least in part on determining that the second memory cell is unselected after the first pulse;
  determine that the second memory cell is unselected after applying the second pulse;
  apply, to the second memory cell, a third pulse during a third duration of the selection procedure based at least in part on determining that the second memory cell is unselected after the second pulse; and
  write a second logic state to the second memory cell.

21. The apparatus of claim 20, wherein:
the first pulse has a first voltage;
the second pulse has a second voltage higher than the first voltage; and
the third has the second voltage.

22. The apparatus of claim 20, wherein the second tile is further configured to:
  deselect a third memory cell of the second tile during at least a portion of the third duration associated with the third pulse, the second memory cell coupled with a digit line of the second tile and the third memory cell coupled with the digit line.

23. The apparatus of claim 20, wherein determining that the second memory cell is unselected further comprises:
  determining whether a snap back event occurs at the second memory cell.

24. The apparatus of claim 20, wherein the memory cells of the first tile and the memory cells of the second tile comprise chalcogenide material.

* * * * *